(12) United States Patent
Pai et al.

(10) Patent No.: US 6,525,962 B1
(45) Date of Patent: Feb. 25, 2003

(54) HIGH CURRENT AND/OR HIGH SPEED ELECTRICALLY ERASABLE MEMORY CELL FOR PROGRAMMABLE LOGIC DEVICES

(75) Inventors: Sheng-Yueh Pai, Saratoga, CA (US); Yue Chen, San Jose, CA (US); Kevin Yen, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/543,462

(22) Filed: Apr. 5, 2000

(51) Int. Cl.$^7$ .............................................. G11C 16/06
(52) U.S. Cl. ........................... 365/185.09; 365/185.05; 257/314; 257/315
(58) Field of Search ..................... 365/185.09, 185.05; 257/314, 315, 316, 317, 319, 320, 390

(56) References Cited

U.S. PATENT DOCUMENTS

| | | | |
|---|---|---|---|
| 5,273,923 A | * 12/1993 | Chang et al. | ............... 257/314 |
| 5,326,999 A | * 7/1994 | Sim et al. | ................... 257/314 |
| 5,422,504 A | * 6/1995 | Chang et al. | ............... 257/315 |
| 6,023,085 A | * 2/2000 | Fang | ......................... 257/314 |

* cited by examiner

*Primary Examiner*—Son T. Dinh
(74) *Attorney, Agent, or Firm*—Bradley T Sako

(57) ABSTRACT

An electrically erasable programmable logic device (EEPLD) cell (100) is disclosed. A folded floating gate (110) and folded select gate (108) can form two parallel read current paths (Isense0 and Isense1). A first read current path (Isense0) may be formed between a first semiconductor region (104) and a second semiconductor region (106-0), and may be controlled by a first floating gate portion (110-0) and a first select gate portion (108-0). A second read current path (Isense1) may be formed between the first semiconductor region (104) and a third semiconductor region (106-1) that is coupled to a second semiconductor region (106-0). A second read current path (Isense1) may be controlled by a second floating gate portion (110-1) and a second select gate portion (108-1).

20 Claims, 3 Drawing Sheets

US 6,525,962 B1

HIGH CURRENT AND/OR HIGH SPEED ELECTRICALLY ERASABLE MEMORY CELL FOR PROGRAMMABLE LOGIC DEVICES

TECHNICAL FIELD

The present invention relates generally to programmable logic devices, and more particularly to nonvolatile memory cells for use in programmable logic devices.

BACKGROUND OF THE INVENTION

Programmable logic has increasingly become a valued resource for system designers. Programmable logic can allow for a custom logic design to be implemented without the initial cost, delay and complexity of designing and fabricating an application specific integrated circuit (ASIC).

Currently, there are many variations of programmable logic, including simple programmable logic devices (SPLDs), complex PLDs (CPLDs), and field programmable gate arrays (FPGAs). Such devices typically include logic circuits and corresponding memory circuits. The particular function of a logic circuit can be determined according to data stored in a corresponding memory circuit. Some programmable logic arrangements can include switching circuits (also called programmable interconnects) that enable and/or disable switching paths according to data stored in a memory circuit.

A programmable logic memory circuit may be volatile or non-volatile. One particular example of a volatile memory circuit can be a static random access memory (SRAM) cell. A drawback to volatile approaches is that an ancillary non-volatile memory (such as a programmable read only memory (PROM)) is usually necessary. Upon power-up, data from a PROM can be loaded into SRAM cells of a programmable logic device. An advantage of volatile programmable logic can be the increased speed of such devices and/or a simpler manufacturing process technology. A disadvantage can be the volatile nature of such devices. A power-up/loading step, such as that described above, can introduce more delay into the startup operation of a device. Further, the addition of an ancillary non-volatile memory device may increase size and/or cost.

Non-volatile programmable logic typically does not require a power-up loading step. Currently, there are a number of approaches to forming non-volatile programmable logic. Such approaches may generally be categorized as "one time programmable" (OTP) or "in system programmable" (ISP). OTP devices may include approaches that use fuses, anti-fuses and/or electrically erasable read only memories (EPROMs). For the most part, once OTP devices are programmed, their functionality may not be changed. (EPROM based devices may include ultra-violet light windows for erasing, but typically at a prohibitively high increase in packaging cost).

In contrast to OTP devices, ISP devices may be reprogrammed. This can be a particularly valuable feature as designs may go through prototyping and/or revisions. Some ISP devices may be reprogrammed even after being soldered or otherwise connected to a circuit board. ISP devices may include programmable non-volatile memory devices such as electrically erasable and programmable read-only-memories (EEPROMs), including "flash" EEPROMs (which can allow for the rapid simultaneous erasure of multiple memory cells).

EEPROM structures (including flash EEPROM structures) typically utilize a floating gate that may be programmed and/or erased by placing charge on the floating gate. Various charge transport mechanisms can be utilized, including Fowler-Nordheim tunneling and/or channel hot electron injection, to name two examples.

Regardless of the particular programmable logic circuit structure employed, an increasing concern with programmable logic can be the operating speed and the power supply level requirement of such devices. An operating speed is typically the time required for applied input signals to generate corresponding output signals. Many aspects of a programmable logic design can impact operating speed. One aspect can include the speed at which memory cell data can be read. At the same time system speeds are increasing, the operating voltages of such systems are falling. Lower operating voltages may typically translate into lower operating speeds. For these and other reasons, it would be desirable to arrive at some way of increasing operating speed to compensate for speed reductions introduced by lower operating voltages.

Having described the general operation and variations of programmable logic devices, a particular conventional programmable logic memory cell will now be described. Referring now to FIG. 3, a conventional electrically erasable programmable logic device (EEPLD) cell is illustrated in a top plan view and designated by the general reference character 300. An EEPLD cell 300 may be conceptualized as including a cell boundary 302. A cell boundary 302 may define the limits of a repeatable structure within an integrated circuit. A mirror image repetition may be advantageous if contact sharing between adjacent cells is desirable.

A conventional EEPLD 300 may further include a first semiconductor region 304 and a second semiconductor region 306. First and second semiconductor regions (304 and 306) may include diffusions regions formed in a semiconductor substrate. Such diffusion regions may be formed by ion implantation or other conventional methods. First and second semiconductor regions (304 and 306) may be bounded by isolation structures (not shown) such as those formed by LOCOS (local oxidation of silicon) or STI (shallow trench isolation), or gate structures, as will be described below.

A conventional EEPLD 300 may further include a select gate 308 and a floating gate 310 situated between a first and second semiconductor region (304 and 306). The conductivity between a first and second semiconductor region (304 and 306) may be controlled by the particular state of a select gate 308 and floating gate 310. More particularly, a floating gate 310 may be programmed or erased, and thereby enable conductivity between the first and second semiconductor regions (304 and 306). In addition, a select gate 308 may be driven between a select and de-select potential and thereby enable conductivity between the first and second semiconductor regions.

Thus, when the select gate 308 is at a de-select potential, a relatively high impedance can exist between first and second semiconductor regions (304 and 306). However, when a select gate 308 is at a select potential, the impedance between first and second semiconductor regions (304 and 306) may depend upon a floating gate 310. If a floating gate 310 is in one state (e.g., erased) a relatively high impedance can exist between first and second semiconductor regions (304 and 306). If a floating gate 310 is in another state (e.g., programmed) a relatively low impedance can exist between first and second semiconductor regions (304 and 306).

An alternate way of conceptualizing the conventional approach shown in FIG. 3 is to consider a controllable current path Isense as existing between a first and a second semiconductor portion (304 and 306). The conductivity of the current path Isense may be controlled by a select gate 308 and a floating gate 310. FIG. 4 shows a side cross-sectional view taken along line 4—4 to illustrate such a current path Isense. It is understood that by reversing a voltage applied between a first and a second semiconductor portion (304 and 306), the direction of a current path Isense may be reversed.

In the example of FIG. 3, a first semiconductor region 304 may include a first sense contact 312 that may be connected to a sense amplifier (not shown). Similarly, a second semiconductor region 306 can include a second sense contact 314 that may also be connected to a sense amplifier. A select gate 308 may include a select contact 316 that can be connected to a select line (not shown). In this way, a select line can be activated to provide memory data to a sense amplifier. A sense amplifier can amplify this information and use such information to establish the functionality of one or more logic circuits in a PLD.

A conventional EEPLD cell 300 may also include a programming portion 318 and a charge storage portion 320. A programming portion 318 may include circuit structures that establish the state of a floating gate 310. The particular programming portion 318 of FIG. 3 includes a programming node 322, a programming gate 324, and a tunneling region 326. A programming node 322 may receive a programming voltage that is relatively high in magnitude with respect to the power supply voltage of a PLD. A programming gate 324 may pass a programming voltage to a tunneling region 326. A tunneling region 326, when driven to a positive programming voltage, may allow electrons to tunnel through a tunneling dielectric from a floating gate 310, thereby establishing a low or negative threshold voltage for a floating gate 310. A low or negative threshold voltage may place a floating gate in a conducting state.

A floating gate 310 may also be placed into a non-conducting state by establishing a high threshold voltage. A positive erasure voltage may be applied to an erase node 330. An erasure voltage may be capacitively coupled to coupling capacitor portion 320. When an erasure voltage is sufficiently high, electrons may tunnel back through tunneling regions 326.

It is noted that coupling capacitor portion 320 can be relatively large to provide a larger capacitive coupling ratio between a capacitor formed at the tunneling region 326, and a capacitor formed between erase node 330 and coupling capacitor portion 320. A higher capacitive coupling ratio can speed erase and program operations.

It is noted that a limiting factor in EEPLD cell sizes can be a programming portion 318. As noted above, a programming portion 318 may have to supply a relatively high programming voltage. To enable such a function, a programming portion 318 may include high voltage structures for carrying such a programming voltage. Such structures may include particular diffusion schemes and/or isolation structures. Consequently, there may be a minimum spacing requirement between a programming portion 318 and adjacent circuit structures.

While the above-described conventional EEPLD cell can provide adequate functionality at particular speeds, there is a need for an even faster EEPLD cell for the various reasons described above.

One approach to increasing the speed of a cell such as that shown in FIG. 3, could be to increase the overall size of a select transistor 310. Such an approach can increase the overall size of a resulting PLD. This is undesirable as it may lead to increased manufacturing cost. Further, increasing a select transistor size may increase parasitic junction capacitance along the current path Isense. This may result in slower performance.

SUMMARY OF THE INVENTION

The present invention includes an electrically erasable and programmable logic device (EEPLD) cell that may provide higher read currents than conventional approaches. Unlike conventional approaches that include a single read current path, the present invention can provide multiple read current paths.

According to one embodiment, multiple read current paths may be provided by including a folded floating gate and folded select gate. In such an arrangement, the conductivity of a first current path may be controlled by a first portion of a floating gate and a first portion of a select gate. In addition, the conductivity of a second current path may be controlled by a second portion of a floating gate and a second portion of a select gate. Multiple current paths may result in larger read current and hence faster circuit operation.

According to one aspect of the invention, first select gate portions may be parallel to first floating gate portions. Such an arrangement may allow such structures to be separated form one another by a minimum process feature size, or a feature size smaller than conventional spacing used for EEPLD logic circuits or the like.

According to another aspect of the invention, to allow for a more compact structure, a select gate and/or a floating gate may have a gate length that is less than the gate lengths of conventional transistors, such as those used to form logic circuits in an EEPLD.

According to another aspect of the invention, current paths may include diffusion regions associated with the select gate and/or floating gate portions. A lateral diffusion of such diffusion regions may be less than that of conventional transistor sources and drains, such as those transistors used to form logic circuits in an EEPLD. Such an approach may also produce a more compact structure.

According to another aspect of the invention, each current path may include a select gate portion that is electrically in series with a corresponding floating gate portion. Thus, a select gate portion and corresponding floating gate portion can be in predetermined states to provide a low impedance current path.

According to another aspect of the invention, a select gate may be disposed over a select gate insulator and a floating gate may be disposed over a floating gate insulator that is greater than a select gate insulator. Such an arrangement can provide for rapid select gate operation while at the same time maintaining charge storage characteristics in a floating gate.

DETAILED DESCRIPTION OF THE EMBODIMENTS

Various embodiments will now be described in conjunction with a number of diagrams. The embodiments set forth an electrically erasable and programmable logic device (EEPLD) cell that can provide a higher operating speed than conventional approaches.

Figure 1:
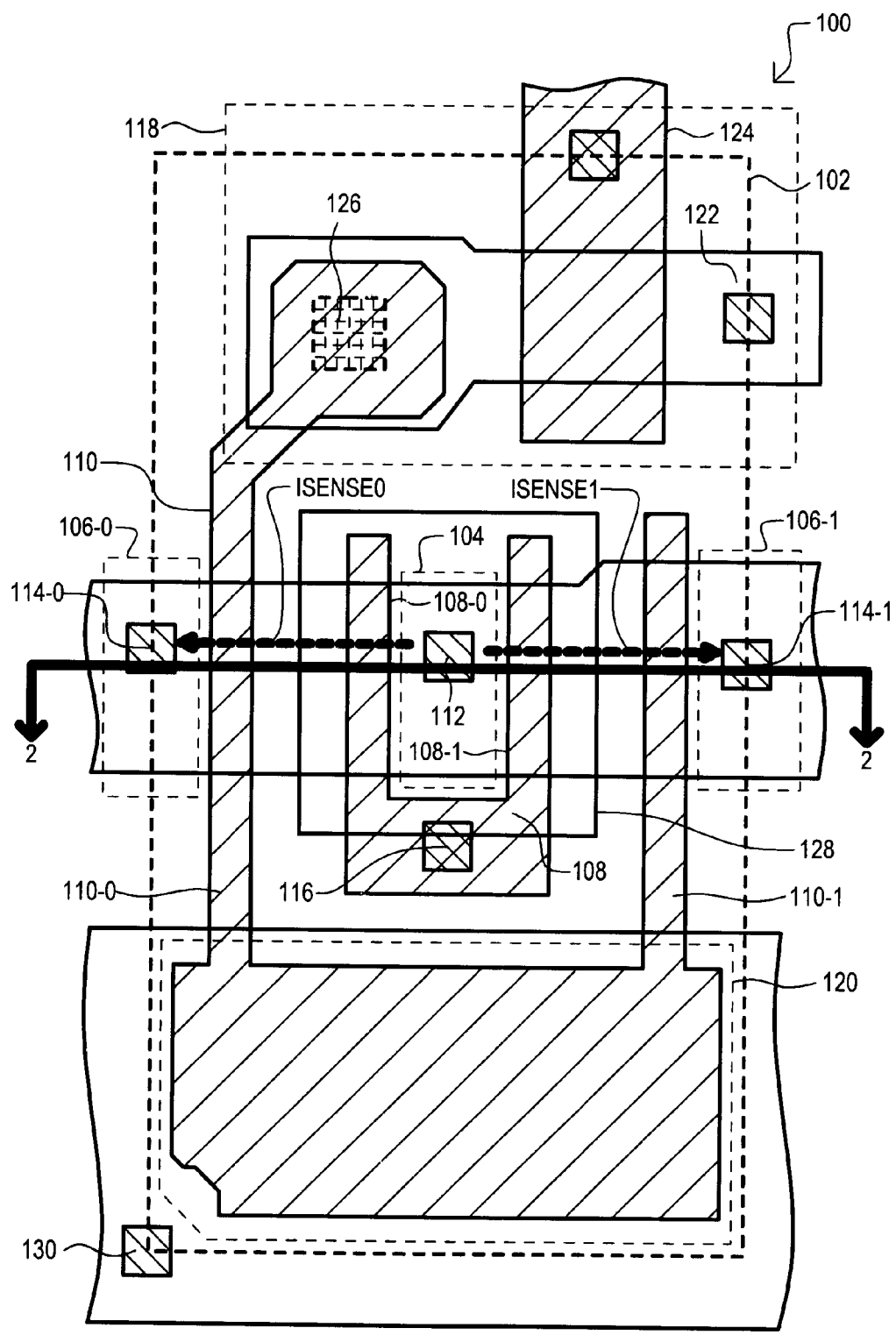
FIG. 1 is a top plan view of an electrically erasable and programmable logic device (EEPLD) cell according to one embodiment.

Referring now to FIG. 1, an electrically erasable programmable logic device (EEPLD) cell according to one embodiment is illustrated in a top plan view and designated by the general reference character 100. A boundary 102 is shown around the EEPLD cell 100 that illustrates how the EEPLD cell 100 may be repeated within a larger integrated circuit.

Unlike the conventional case described above, an EEPLD 100 according to the embodiment of FIG. 1 may include a first semiconductor region 104, a second semiconductor region 106-0, and a third semiconductor region 106-1. First through third semiconductor regions (104, 106-0 and 106-1) may include diffusions regions formed in a semiconductor substrate by ion implantation or other conventional methods. First through third semiconductor regions (104, 106-0 and 106-1) may also be defined by isolation structures (not shown), gate structures, and/or the limits of a diffusion region. Isolation structures may include those formed by LOCOS (local oxidation of silicon), STI (shallow trench isolation), or other methods.

It is noted that the second semiconductor region 106-0 and third semiconductor region 106-1 may be connected to one another. Such a connection may include a higher level conductive interconnect pattern (not shown).

The present invention may further include a select gate 108 and a floating gate 110. Unlike the conventional example, a select gate 108 may include a first portion 108-0 and a second portion 108-1. Further, a floating gate 110 may include also include a first portion 110-0 and a second portion 110-1.

First portions (108-0 and 110-0) of a select gate and floating gate may be situated between a first semiconductor region 104 and a second semiconductor region 106-0. Similarly, second portions (108-1 and 110-1) of a select gate and floating gate may be situated between a first semiconductor region 104 and a third semiconductor region 106-1. Consequently, the conductivity between a first semiconductor region 104 and a second semiconductor region 106-0, and between a first semiconductor region 104 and a second semiconductor region 106-1 may be controlled by the particular state of a select gate 108 and a floating gate 110.

A select gate 108 may be driven between states. More particularly, a select gate 108, and hence its first and second portions (108-0 and 108-1), may be driven between a select potential and a de-select potential. Further, charge may be placed on a floating gate 110 to establish a predetermined state. More particularly, a floating gate 110, and hence its, first and second portions (110-0 and 110-1) may be programmed to one state, and erased to another state.

In operation, a select gate 108 can initially be driven to a de-select potential. In such a state, a select gate first portion 108-0 can create a high impedance between a first semiconductor region 104 and a second semiconductor region 106-0. Such an impedance is high, irrespective of the state of a floating gate 110. Further, a select gate second portion 108-1 can create a high impedance between a first semiconductor region 104 and a third semiconductor region 106-1. Again, such an impedance can be high irrespective of the state of a floating gate 110.

A select gate 108 may subsequently be driven to a select potential. Such an operation may occur when data is to be read from an EEPLD cell 100. When a select gate 108 is at a select potential, the conductivity between first, second and third semiconductor regions (104, 106-0 and 106-1) can depend upon the state of a floating gate 110.

In one particular arrangement, if a select gate 108 is at a select potential and a floating gate 110 is in one state (programmed, for example), a select gate first portion 108-0 and floating gate first portion 110-0 can enable a low impedance path between a first semiconductor region 104 and a second semiconductor region 106-0. Further, a select gate second portion 108-1 and floating gate second portion 110-1 can enable a low impedance path between a first semiconductor region 104 and a third semiconductor region 106-1. However, if a select gate 108 is at a select potential and a floating gate 110 is in another state (erased, for example), a floating gate first portion 110-0 can form a high impedance path between a first semiconductor region 104 and a second semiconductor region 106-0. At the same time, a floating gate second portion 110-1 can form a high impedance path between a first semiconductor region 104 and a third semiconductor region 106-1.

Figure 2:
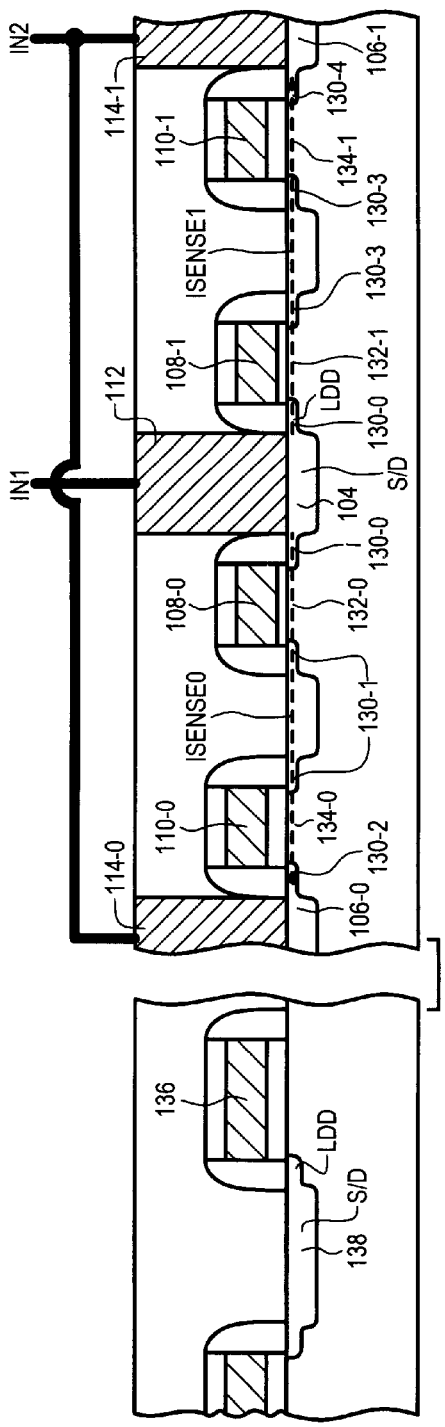
FIG. 2 is a side cross sectional view of an EEPLD cell according to one embodiment.
Figure 4:
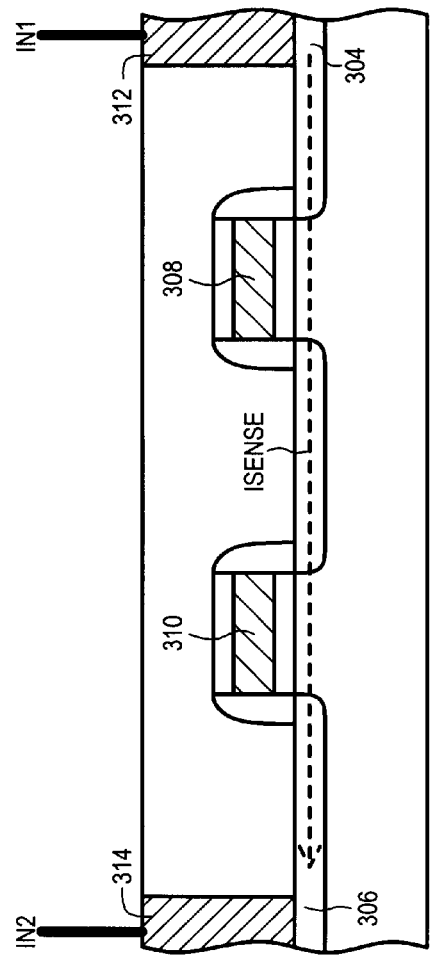
FIG. 4 is a side cross sectional view of a conventional EEPLD cell.

An alternate way of conceptualizing the embodiment of FIG. 1, is to consider a first controllable current path Isense0 as existing between a first semiconductor region 104 and a second semiconductor region 106-0, and a second controllable current path Isense1 as existing between a first semiconductor region 104 and a third semiconductor region 106-1. FIG. 2 shows a side cross-sectional view taken along line 2—2 of FIG. 1, to illustrate such current paths (Isense0 and Isense1).

FIG. 1 also shows various contacts to the regions and structures previously described. In particular, a first semiconductor region 104 may include a first sense contact 112. A first sense contact 112 may be connected to a sense amplifier (not shown). Similarly, a second semiconductor region 106-0 can include a second sense contact 114-0 that may also be connected to a sense amplifier. Further, a third semiconductor region 106-1 can include a third sense contact 114-1 that may also be connected to a sense amplifier. As noted above, a second semiconductor region 106-0 and third semiconductor region 106-1 may be connected to one another. Such a connection may include a conductive interconnect that joins a second sense contact 114-1 to a third sense contact 114-2.

A select contact 116 can be connected to select gate 108. A select contact 116 may receive a select signal that can drive a select gate 108 between a select and de-select potential.

In the above described arrangement, a select gate 108 can be driven to a select potential, and a sense amplifier can read a logic value determined by a state of floating gate 110. More particularly, a sense amplifier can have one input connected to first sense contact 112 and another input connected to second and third contacts (114-0/114-1). A logic value that is read may then be used to establish logic operations in a PLD.

The embodiment of FIG. 1 may also include a programming portion 118 and a coupling capacitor portion 120. A programming portion 118 may include high voltage structures that can be used to establish the state of a floating gate 110. More particularly, a programming portion 118 can include a high voltage programming transistor comprising a programming node 122, a programming gate 124 and a tunneling region 126. In operation, a programming voltage can be supplied to programming node 122. A programming voltage can have a magnitude that is large with respect to the normal operating voltage of a PLD. With a programming voltage at programming node 122, programming gate 124 can be driven to a programming select potential. This can enable a conductive path between programming node 122 and tunneling region 126. With a positive programming voltage at a tunneling region 126, electrons can tunnel from a floating gate 110 to a tunneling region 126 through a tunneling dielectric (not shown). In this way, a floating gate 110 can be programmed to one state. Such a state may be a low or negative threshold voltage. A low or negative threshold voltage may place a floating gate in a conducting state. As but one particular example, a programming voltage may be in the general range of +10.8 volts.

A floating gate 110 may also be erased to a non-conducting state. A positive erasure voltage may be applied to an erase node 130. An erasure voltage may be capacitively coupled to a coupling capacitor portion 120. When an erasure voltage is sufficiently high, electrons may tunnel back through tunneling region 126. A but one particular example, an erase voltage may be in the general range of +13.0 volts.

A coupling capacitor portion 120 can be large with respect to tunneling region 126 to provide a larger capacitive coupling ratio between a capacitor formed at the tunneling region 126, and a capacitor formed between erase node 130 and coupling capacitor portion 120. As in the case of a conventional structure, a higher capacitive coupling ratio can speed erase and program operations.

Figure 3:
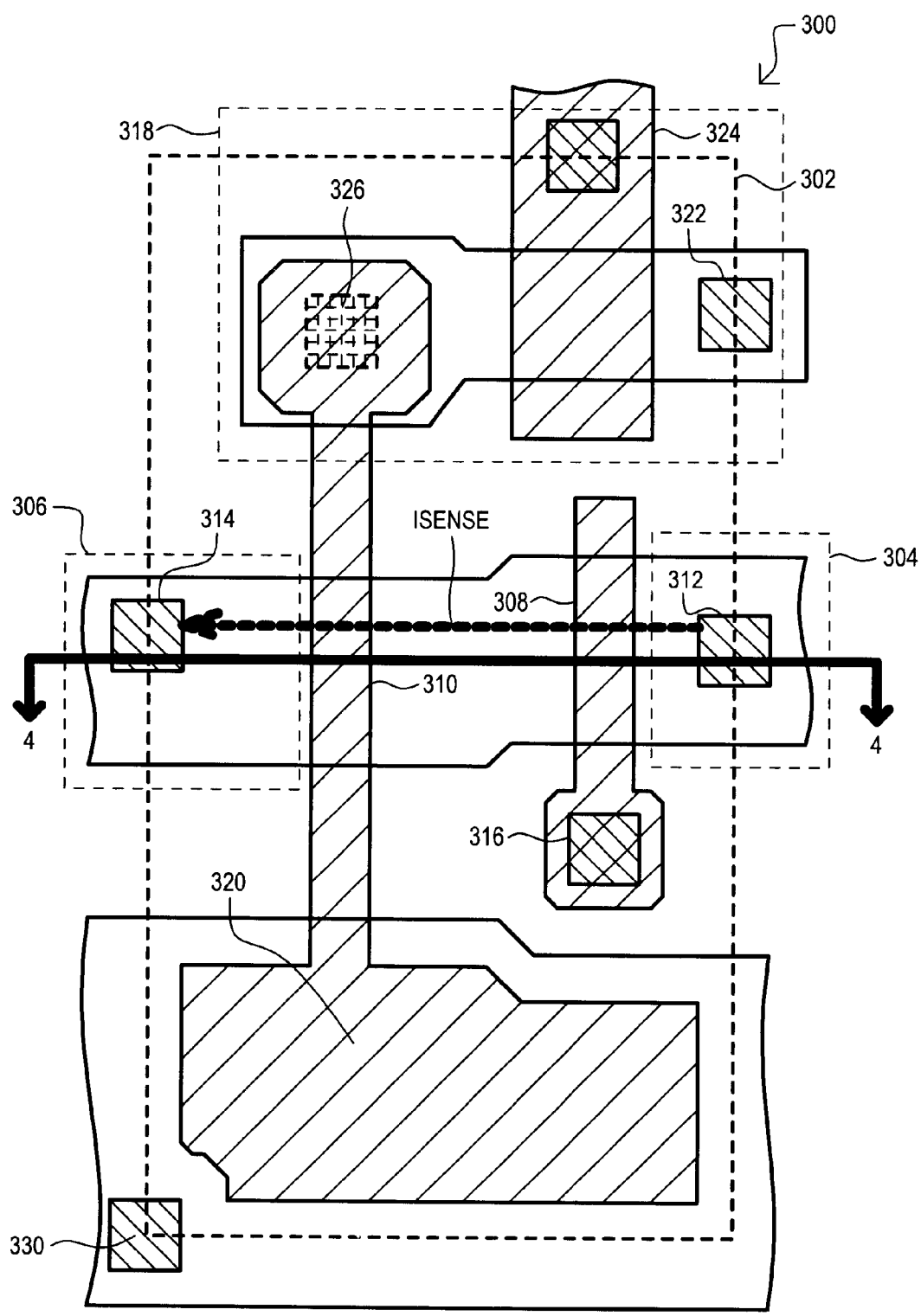
FIG. 3 is a top plan view of a conventional EEPLD cell.

As in the conventional case, a limiting factor on EEPLD cell sizes may be a programming portion 118, due to high voltage structures therein. However, if reference is made back to FIG. 3, it is noted that due to the size of programming portion 318, a select gate 308 and a floating gate 110 may be separated from one another by more than a minimum spacing requirement (which may be typically dictated by photolithographic limitations). An EEPLD 100 according to one embodiment may take advantage of available area and essentially "fold" a select gate 108 and a floating gate 110 over an available active area. Such an arrangement can double the overall current path.

In one particular arrangement, first floating gate portion 110-0 may be separated from first select gate portion 108-0 by a minimum spacing. Similarly, second floating gate portion 110-1 may be separated from second select gate portion 108-1 by a minimum spacing. A minimum spacing requirement may be determined according to the limits of a photolithographic process used to fabricate a select gate 108 and a floating gate 110.

It is noted that in some arrangements it may be desirable to provide a gate insulator thickness for a select gate 108 that is different from that of a floating gate 110. More particularly, it may be desirable to have a greater floating gate insulator thickness for a floating gate 110 to preserve charge stored therein, while a thinner select gate insulator thickness may provide for more rapid switching speeds. Consequently, one version of the invention may include a select gate window 128. A select gate window 128 may be used to "thin" an already deposited gate insulator, or remove a deposited gate insulator and then subsequently grow and/or deposit another, thinner gate insulator.

It is also noted that if spacing requirements are more restrictive, some arrangements may scale select gate 108 and/or floating gate 110 lengths below those of other devices in a PLD. In particular, a logic device may include logic gate circuits that formed with a minimum logic gate length. A gate length of a select gate 108 and/or a floating gate 110 may be smaller than a minimum logic circuit gate length.

Reductions in gate length and/or minimum spacing between a select gate 108 and/or floating gate 110 may also include a source and/or drain regions with reduced lateral diffusion of dopants. As but one example, a different source/drain implant step may be used to form such source and drain regions. More particularly, such regions may be formed with a lightly doped source/drain (LDD) process that implants a lower concentration of dopants than source-drain regions of other devices in a PLD. If reference is made back to FIG. 2, a first read current path Isense0 may include LDD region 130-0, select channel region 132-0, LDD region 130-1, floating gate channel 134-0, and LDD region 130-2. Similarly, a second read current path Isense1 may include LDD region 130-0, select channel region 132-1, LDD region 130-3, floating gate channel 134-1, and LDD region 130-4.

FIG. 2 also shows a logic circuit gate 136 having a minimum logic circuit gate length. The gate length of select gate 108 and floating gate 110 is shown to be less than a minimum logic circuit gate 136. A logic circuit source/drain region 138 is also shown. It may be desirable to provide lighter LDD regions (130-0 to 130-4) than conventional approaches. If a process inherently includes lighter LDD devices, LDD regions (130-0 and 130-4) may be formed as such devices. As but one example, a process may be capable of forming both 5 volt transistors and 3 volt transistors. In such a case, a logic circuit gate 136 may represent a 5 volt device while LDD regions (130-0 to 130-4) can be formed as 3 volt devices. Of course, other logic circuit gates may also be formed as 3 volt devices. In the event a manufacturing process does not include such a selection between devices, it may be desirable to include an LDD implant step the forms LDD regions (130-0 to 130-4) that are more lightly doped than other higher voltage devices.

While reductions in gate length can lead to lower transistor breakdown voltages, it is noted that in one embodiment, a read voltage across current paths Isense1 and Isense2 can be less than a power supply voltage for a PLD. As but one example, a PLD may have a power supply of 3.3 volts, while a read voltage may be in the general range of 1.2 volts. Thus, scaling of select gate 108 and/or floating gate 110 lengths may be undertaken without necessarily incurring adverse effects on reliability.

It is noted that the particular EEPLD 100 of FIG. 1 may be fabricated with a process that includes a single polycrystalline silicon (poly) layer deposition step (a "single poly process"). Such a process can be more economical than more complicated processes requiring two or more poly deposition steps. Thus, the invention may provide improved speed yet not necessarily require additional and/or more complex process steps.

It is also noted that while the terms "programming" and "erase" have been used to describe processes for establishing particular states of a floating gate, in some approaches such terms are switched, and/or may be dependent upon the particular conductivity of transistors within an EEPLD cell. For example, "erase" may include tunneling transistors charge from a floating gate for n-channel devices, while "erase" may include tunneling transistors to a floating gate for a p-channel device, or vice/versa. Accordingly, the terms erase and program should not be limited to the transport of a particular charge type.

It is further noted that the present invention can provide a way of maintaining and/or increasing read current as semiconductor device features are scaled down. In particular, while a floating gate and/or select gate may be scaled as process technologies provide for smaller device features, programming devices may not be capable of corresponding reductions in size. Consequently, a programming portion (such as 118 shown in FIG. 1) may be a feature that limits reductions in EEPLD cell size. The present invention may make advantageous use of available cell area that may result.

Thus, it is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A programmable logic device (PLD) storage element, comprising:
   a floating gate having a first portion between a first semiconductor region and a second semiconductor region and a second portion between the first semiconductor region and a third semiconductor region, the second semiconductor region being connected to the third semiconductor region; and
   a select gate having a first portion between the first semiconductor region and the second semiconductor region and a second portion between the first semiconductor region and the third semiconductor region.

2. The PLD storage element of claim 1, wherein:
   the floating gate first portion is physically parallel to the select gate first portion.

3. The PLD storage element of claim 2, wherein:
   the floating gate second portion is physically parallel to the select gate second portion.

4. The PLD storage element of claim 1, further including:
   at least one logic circuit gate having a minimum logic circuit gate length; and
   the floating gate has a gate length less than the minimum logic circuit gate length.

5. The PLD storage element of claim 1, further including:
   at least one logic circuit gate having a minimum logic circuit gate length; and
   the select gate has a gate length less than the minimum logic circuit gate length.

6. The PLD storage element of claim 1, further including:
   at least one logic circuit having a transistor diffusion region with a first doping concentration; and
   a select gate diffusion region adjacent to the select gate with a doping concentration less than the first doping concentration.

7. The PLD storage element of claim 1, further including:
   at least one logic circuit having a transistor diffusion region with a first doping concentration; and
   a floating gate diffusion region adjacent to the select gate with a doping concentration less than the first doping concentration.

8. A programmable logic circuit, comprising:
   a first current path having an impedance controlled by a first portion of a select gate and a first portion of a floating gate; and
   a second current path electrically parallel to the first current path having an impedance controlled by a second portion of the select gate and a second portion of the floating gate.

9. The programmable logic circuit of claim 8, further including:
   a first gate insulator between the select gate and a substrate; and
   a second gate insulator between the floating gate and the substrate, the second gate insulator thickness being greater than that of the first gate insulator.

10. The programmable logic circuit of claim 8, wherein:
    the first current path is disposed between a first contact and a second contact; and
    the second current path is disposed between the first contact and a third contact that is coupled to the second contact.

11. The programmable logic circuit of claim 8, further including:
    a tunneling region below the floating gate.

12. The programmable logic circuit of claim 11, further including:
    a programming transistor for controlling the tunneling region, the programming transistor being capable of receiving a voltage that is greater than a supply voltage for the programmable logic circuit.

13. The programmable logic circuit of claim 11, wherein:
    the floating gate includes a coupling capacitor portion having an area that is larger than the area of the tunneling region.

14. The programmable logic circuit of claim 8, wherein:
    the first and second portions of the select gate are situated between the first and second portions of the floating gate.

15. A non-volatile electrically erasable programmable logic device (EEPLD) cell, comprising:
    a select gate and a floating gate that control the conductivity between a first substrate region and two physically separate but electrically connected second substrate regions.

16. The EEPLD cell of claim 15, further including:
    a select gate first portion and floating gate first portion electrically in series between the first substrate region and one of the second substrate regions; and
    a select gate second portion and floating gate second portion electrically in series between the first substrate region and the other of the second substrate regions.

17. The EEPLD cell of claim 16, wherein:
    the select gate first portion is electrically in series with the select gate second portion.

18. The EEPLD cell of claim 15, wherein:
    the EEPLD cell is part of a PLD having a plurality of logic gates with at least one minimum logic transistor gate length; and
    the select gate has gate length less than the minimum logic transistor gate length.

19. The EEPLD cell of claim 15, further including:
    the EEPLD cell is part of a PLD having a plurality of logic gates with at least one logic transistor having source and drain regions with a minimum lateral diffusion size; and
    a current path diffusion region between one portion of a floating gate and an adjacent portion of a select gate, the current path diffusion region having a smaller lateral diffusion size than the minimum lateral diffusion size.

20. The EEPLD cell of claim 15, wherein:
    the floating gate and select gate are formed from the same layer of polycrystalline silicon.

* * * * *